US007329482B2

(12) United States Patent
Watanabe

(10) Patent No.: US 7,329,482 B2
(45) Date of Patent: Feb. 12, 2008

(54) DAMPENING WATER COMPOSITION FOR LITHOGRAPHIC PRINTING

(75) Inventor: Kuniharu Watanabe, Haibara-gun (JP)

(73) Assignee: Fujifilm Corporation, Minato-Ku, Tokyo (JP)

( * ) Notice: Subject to any disclaimer, the term of this patent is extended or adjusted under 35 U.S.C. 154(b) by 0 days.

(21) Appl. No.: 11/089,326

(22) Filed: Mar. 25, 2005

(65) Prior Publication Data

US 2005/0211130 A1 Sep. 29, 2005

(30) Foreign Application Priority Data

Mar. 26, 2004 (JP) ............................ 2004-091124

(51) Int. Cl.
*G03F 7/12* (2006.01)
*C09K 3/18* (2006.01)

(52) U.S. Cl. .......................................... 430/331; 106/2

(58) Field of Classification Search ................ 430/331; 106/2

See application file for complete search history.

(56) References Cited

U.S. PATENT DOCUMENTS

| | | | | | |
|---|---|---|---|---|---|
| 3,067,149 | A | * | 12/1962 | Dombrow et al. | 521/107 |
| 4,001,133 | A | * | 1/1977 | Sorgenfrei et al. | 134/25.4 |
| 5,054,394 | A | * | 10/1991 | Zweig | 101/451 |
| 5,720,800 | A | * | 2/1998 | Matsumoto | 106/2 |
| 6,479,432 | B1 | * | 11/2002 | Sixl | 504/103 |
| 6,770,427 | B2 | * | 8/2004 | Romero Salvo | 430/331 |
| 2002/0147300 | A1 | * | 10/2002 | Matsumoto | 528/422 |

FOREIGN PATENT DOCUMENTS

| | | | | |
|---|---|---|---|---|
| JP | 406032082 | | * | 2/1994 |
| JP | 2001-138659 | A | | 5/2001 |
| JP | 2002-254852 | A | | 9/2002 |
| JP | 2004-082593 | A | | 3/2004 |

OTHER PUBLICATIONS

Abstracts of JP406032082.*
Machine English language translation of JP406032082.*

* cited by examiner

*Primary Examiner*—Hoa Van Le
(74) *Attorney, Agent, or Firm*—Buchanan Ingersoll & Rooney PC

(57) ABSTRACT

A dampening water composition for a lithographic printing comprising an adduct compound of ethylene oxide and propylene oxide to ethylenediamine, which compound has a weight-average molecular weight of from 500 to 1500. The dampening water composition can be used in printing job without requiring a high degree of skill, and is capable of replacing a conventional dampening water composition using isopropyl alcohol, in various continuous water supply-type printing machines.

9 Claims, No Drawings

DAMPENING WATER COMPOSITION FOR LITHOGRAPHIC PRINTING

FIELD OF THE INVENTION

The present invention relates to a dampening water composition for a lithographic printing.

BACKGROUND OF THE INVENTION

The lithographic printing technique makes the best use of the properties of water and oil such that they are essentially incompatible with each other. Two different areas are formed on the printing surface of a lithographic printing plate, one receiving water and repelling oil ink and the other repelling water and accepting the oil ink. The former serves as a non-image area and the latter becomes an image area.

The non-image area is made damp with a dampening water for use in lithographic printing in practice, thereby increasing the difference in surface chemical properties between the image area and the non-image area. Both the ink repellency of the non-image area and the ink receptivity of the image area can be thus increased.

The conventionally known dampening water are aqueous solutions of, for example, alkali metal salts or ammonium salts of bichromic acid, phosphoric acid or salts thereof such as ammonium salt, and a colloidal substance such as gum arabic or carboxymethyl cellulose (CMC). However, it is difficult to uniformly dampen all the non-image areas formed on the lithographic printing plate with the above-mentioned conventional dampening water, and for this reason, the resultant printed matters sometimes get smudged. In addition, a high degree of skill is required to control the amount of dampening water supplied to the printing plate. Further, recently, there have strict regulations on discharge of chromium ions into a wastewater, and the use of chromic compound tends to be regulated from the viewpoint of safety and health matter.

To overcome such problems, the Dahlgren dampening system has been introduced and widely used, which employs as a dampening water an aqueous solution containing about 20 to 25% of isopropyl alcohol. This method provides some advantages, for example, an improvement in workability and an increase in the accuracy of obtained printed matters. To be more specific, the wettability of the non-image area with the damping water is improved so that the amount of the dampening water to be applied can be reduced. The result is that the balance between the amount of the printing ink and that of the dampening water to be supplied can be easily controlled, and that the amount of water to be emulsified into the printing ink can be lowered, thereby improving the transfer performance of the printing ink to the blanket.

However, isopropyl alcohol used in the Dahlgren dampening system evaporates easily and quickly, differently from water, and therefore, a special device for keeping the predetermined concentration of isopropyl alcohol in the dampening water is required. This is unfavorable from the viewpoint of cost. Moreover, the Dahlgren dampening system is disadvantageous in terms of working environment because isopropyl alcohol gives out a disagreeable smell and produces a problem of toxicity. Isopropyl alcohol is classified into the second group of organic solvents according to Ordinance on the Prevention of Organic Solvent Poisoning, and isopropyl alcohol is now regulated. Isopropyl alcohol is also one of alcohols which are classified into the forth category in hazardous substances, being an ignitable substance, and therefore it is necessary to be careful in the handling and storage management thereof, and being unfavorable in working conditions.

Further, even if such a dampening water containing isopropyl alcohol is applied to a conventional offset printing in which a dampening molleton roller is used, no sufficient effect can be obtained because isopropyl alcohol easily evaporates from the roller surface and the printing plate surface.

Accordingly, a technology for replacement of isopropyl alcohol in a dampening water has been recently proposed, as disclosed in, for example, Japanese Patent Application Publication (hereunder referred to as "JP KOKAI") Nos. Hei 5-92677, Hei 5-318958, 2001-287476, Hei 2-269094, Hei 3-63187, Hei 3-90389, Hei 3-90390, Hei 4-363297, Hei 5-112085, Hei 11-78281, Hei 11-105449, 2001-130164, 2001-138659, 2001-180146, 2001-18553, 2001-71658, 2002-187375, 2002-187376, 2002-192853, Sho 51-72507 and 2002-254852. However, these substitutional techniques use a volatile organic solvent to cause a discharge of VOC (volatile organic compounds), and it is desirable to improve these techniques.

On the other hand, it has been proposed to use an involatile or high boiling compound instead of isopropyl alcohol. For example, J.P. KOKAI No. Sho 51-72507 proposes that a specific alkyleneoxide type-nonionic surfactant is included in a dampening water composition, and J.P. KOKAI No. 2002-254852 proposes that an ethylene oxide and propylene oxide adduct of alkylenediamine is included in a dampening water composition. However, in case that such a dampening water composition is used, when the dampening water that remains on a printing plate surface during stop of a printing machine, becomes in the form of droplet, the water content thereof being evaporated, the involatile or high boiling compound present therein comes to remain in a concentrated condition, and then the compound is liable to exhibit a drawback such that the compound dissolves an image area in the lithographic printing plate and then impairs the image.

SUMMARY OF THE INVENTION

An object of the present invention is to provide a dampening water composition for a lithographic printing, which does not have a toxicity or a drawback residing in a conventional dampening water, and does not require a high degree of skill in a printing job, and can replace completely the isopropyl alcohol based dampening water composition in a printing machine working under any mechanism. An object of the present invention is specifically to provide a dampening water composition for a lithographic printing, which does not dissolve image areas in a printing plate and thus does not impair the image areas, even when the dampening water remaining on the printing plate during stop of a printing machine becomes in the form of droplet and the water content thereof is evaporated. A further object of the present invention is to provide a dampening water composition for a lithographic printing, which can suppress the occurrence of problems during a printing procedure such as smudges on a printing plate, blinding on the printing run, i.e., deterioration of ink-receptivity on image areas, and wash out, and can obtain a high-quality printed matter, without problems from the viewpoint of safety of health and fire.

In order to accomplish the above object, the inventor of this invention has conducted intensive studies on a dampening water composition for the lithographic printing, and have found that an excellent dampening water composition can be attained by using a specific compound in a dampening water composition. Thus the inventor has completed the present invention.

Consequently, the present invention is directed to a dampening water composition for a lithographic printing comprising an adduct compound of ethylene oxide and propylene oxide to ethylenediamine, which compound has a weight-average molecular weight of from 500 to 1500.

In an embodiment of the present invention, the adduct compound of ethylene oxide and propylene oxide to ethylenediamine used is preferably the one wherein a molar ratio of added ethylene oxide and added propylene oxide ranges from 5:95 to 50:50. In a preferable embodiment of the present invention, the dampening water composition further comprises polyvinylpyrrolidone and at least one selected from the group consisting of sugars and glycerin. The dampening water composition of the present invention is as a preferable embodiment thereof, formulated into a dampening water composition that is substantially free of a volatile organic solvent.

The dampening water composition according to the present invention, can be used in printing job without requiring a high degree of skill, and is capable of replacing a dampening water composition using isopropyl alcohol, in various continuous water supply-type printing machines. The dampening water composition of the present invention exhibits an excellent printing properties without causing problems during a printing procedure such as smudges on a printing plate, blinding on the printing run and wash out. Further, even when the dampening water remaining on the printing plate becomes in the form of droplet during stop of a printing machine, for example, during a noon recess and the water content thereof is evaporated, the dampening water composition of the present invention does not dissolve a image portion and thus does not impair the image portion.

According to the dampening water composition of the present invention, isopropyl alcohol can be completely replaced under the condition of substantially free of a volatile organic solvent, problems from the viewpoint of safety of working environment and fire are eliminated, and a high-quality printed matter can be obtained, resulting in improvement of efficiency and productivity in printing.

DETAILED DESCRIPTION OF THE INVENTION

The present invention will now be described in more detail. A dampening water composition is generally commercialized as a concentrated product, and such a concentrated product is properly diluted when used in practice. Herein, such a concentrated product for a dampening water is referred to as a dampening water composition.

The contents or amounts of components for use in the dampening water composition described in this specification are expressed on the basis of the total weight of a dampening water when used in practice, unless otherwise specified.

The adduct compound of ethylene oxide and propylene oxide to ethylenediamine, used in the present invention, has a weight-average molecular weight of from 500 to 1500, preferably from 800 to 1200, and most preferably the vicinity of 1000.

The adduct compound having the above mentioned weight-average molecular weight does not impair an image portion on a printing plate, even when the adduct compound remains on the printing plate through concentration and water-evaporation of the dampening water remaining on the printing plate in the form of droplet during a stop of a printing machine, in a condition uncontrolled. Further, the above adduct compound can substitute for isopropyl alcohol without combination use with a volatile organic solvent.

In the adduct compound, a molar ratio of added ethylene oxide and added propylene oxide ranges preferably from 5:95 to 50:50 from the viewpoint of sufficient printing properties, and more preferably from 20:80 to 35:65.

As to the addition form of ethylene oxide and propylene oxide in the adduct compound, any of a block structure wherein ethylene oxide is first added and then propylene oxide is added, a block structure wherein propylene oxide is first added and then ethylene oxide is added, and a random structure attained by simultaneous addition of ethylene oxide and propylene oxide, may act almost similarly.

The adduct compound of ethylene oxide and propylene oxide to ethylenediamine used in the present invention may be produced by a conventional method, and for example, the adduct compound may be produced by reacting ethylene oxide and propylene oxide with ethylenediamine in the presence of a catalyst.

The adduct compound of ethylene oxide and propylene oxide to ethylenediamine used in the present invention includes a compound represented by the following formula:

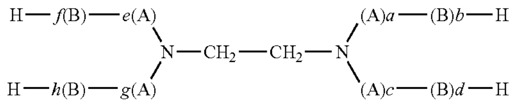

wherein A and B represent each independently $—CH_2CH_2O—$ or $—CH_2CH(CH_3)—$, A and B are different from each other, a, b, c, d, e, f, g and h represent each an integer of 1 or more so that the molecular weight of the compound ranges from 500 to 1500, and the each copolymer chain may have a block structure or a random structure.

A molecular weight of the adduct compound and a molar ratio of added ethylene oxide and added propylene oxide therein may be determined by, for example, measurement of a hydroxyl value and an amine value, and NMR method.

By using a dampening water comprising the above adduct compound in an amount of from 0.01 to 1% by weight, and preferably from 0.05 to 0.5% by weight, excellent printing properties are exhibited even when isopropyl alcohol is not used. After the dampening water is applied to a printing plate, even when the dampening water remains on the printing plate in the form of droplet during stop of a printing machine, the water content thereof is then allowed to be evaporated and the dampening water is eventually concentrated, the above adduct compound does not impair the image area of the printing plate.

The dampening water composition according to the present invention may further comprise a water-soluble polymeric compound.

Examples of the water-soluble polymeric compound for use in the dampening water composition of the present invention are natural compounds and modified products thereof including gum arabic, starch derivatives such as dextrin, enzyme-modified dextrin, hydroxypropylated enzyme-modified dextrin, carboxymethylated starch, starch phosphate, and octenyl succinated starch, alginates, and cellulose derivatives such as carboxymethyl cellulose, carboxyethyl cellulose, hydroxyethyl cellulose, methyl cellulose, hydroxypropylmethyl cellulose, glyoxal-modified product thereof; and synthetic compounds such as polyvinyl alcohol and derivatives thereof, polyvinylpyrrolidone, polyacrylamide and copolymers thereof, polyacrylic acid and copolymers thereof, vinyl methyl ether—maleic anhydride copolymer, vinyl acetate—maleic anhydride copolymer and the like.

The above water-soluble polymeric compound may be used alone or in combination, and the content of the water-soluble polymeric compound in a dampening water ranges suitably from 0.0001 to 5% by weight, and preferably from 0.003 to 1% by weight.

Among the above water-soluble polymeric compounds, polyvinylpyrrolidone may be particularly used in the present invention. The polyvinylpyrrolidone in the dampening water composition denotes homopolymers of vinylpyrrolidone. Said polyvinylpyrrolidone is suitably those having a molecular weight of from 200 to 3,000,000, preferably from 300 to 500,000, more preferably from 300 to 100,000, and most preferably from 300 to 30,000. The polyvinylpyrrolidone may is used alone, or may be used in combination of those having diverse molecular weights. Further, it is also possible to use additionally, polyvinylpyrrolidone having a low molecular weight, for example, a vinylpyrrolidone oligomer having a degree of polymerization of from 3 to 5.

As the above polyvinylpyrrolidone, commercial products may be used. Examples of the commercial product of polyvinylpyrrolidone include various grades of K-15, K-30, K-60, K-90, K-120 and the like which are manufactured by ISP Co., Ltd.

The content of polyvinylpyrrolidone in the dampening water ranges suitably from 0.001 to 0.3% by weight, and preferably form 0.005 to 0.2% by weight.

The dampening water composition of the present invention may comprise preferably at least one selected from the group consisting of sugars and glycerin. The sugars for use in the dampening water composition include monosaccharides, disaccharides, oligosaccharides and the like. The sugars also include sugar alcohols obtained by hydrogenation of a sugar. Examples of the sugar are D-erythrose, D-threose, D-arabinose, D-ribose, D-xylose, D-erythro-pentulose, D-allulose, D-galactose, D-glucose, D-mannose, D-talose, β-D-fructose, α-L-sorbose, 6-deoxy-D-glucose, D-glycero-D-galactose, α-D-allulo-heptulose, β-D-altro-3-heptulose, saccharose, lactose, D-maltose, isomaltose, inulobiose, maltotriose, D,L-arabite, ribite, xylitol, D,L-sorbite, D,L-mannite, D,L-idite, D,L-talite, dulcite, allodulcite, maltitol, reduced starch syrup and the like. The sugar may be used alone or in combination.

Glycerin may be used alone, or may be used in combination with the sugar.

The content of at least one selected from the group consisting of sugars and glycerin in the dampening water ranges suitably from 0.01 to 1% by weight, and preferably from 0.05 to 0.5% by weight.

In general, a dampening water is desirably used at pH range of approximately from 3 to 6. When the value of pH in a dampening water is less than pH 3, an etching effect to a substrate of printing plate tends to increase, and then a printing durability of a printing plate is deteriorated. In order to adjust the pH of from 3 to 6, generally, an organic acid and/or an inorganic acid and/or a salt thereof may be added to a dampening water composition. Examples of a preferable organic acid are citric acid, ascorbic acid, malic acid, tartaric acid, lactic acid, acetic acid, glycolic acid, gluconic acid, butyric acid, hydroxyacetic acid, oxalic acid, malonic acid, levulinic acid, sulfanilic acid, p-toluenesulfonic acid, phytic acid, organic phosphonic acid, and the like. Examples of an inorganic acid are phosphoric acid, nitric acid, sulfuric acid, polyphosphoric acid, and the like. Further, alkali metal salts, alkaline-earth metal salts, ammonium salts and organic amine salts of the above-mentioned organic and/or inorganic acids may also be used. These organic acids, inorganic acids and/or the salts thereof may be used alone or in combination.

Alternatively, the dampening water composition of the present invention may comprise a compound such as hydroxides of alkali metals, alkali metal salts of phosphoric acid, alkali metal salts of carbonic acid and silicate and the like, so that the dampening water can be used in an alkaline region of approximately pH 7 to 11.

As other than the above components, a chelating agent may be added to the dampening water composition of the present invention. Usually, a dampening water composition is used in practice by diluting the concentrated dampening water composition with tap water or well water. Calcium ions and the like contained in the tap water or well water are considered to adversely affect the printing operation and cause the printed matters to be easily smudged. The addition of the chelating agent to the dampening water composition can solve the above-mentioned problem.

Examples of the preferred chelating agent include aminopolycarboxylic acids and salts thereof such as ethylenediaminetetraacetic acid, and potassium and sodium salts thereof; diethylenetriaminepentaacetic acid, and potassium and sodium salts thereof; triethylenetetraminehexaacetic acid, and potassium and sodium salts thereof; hydroxyethylethylenediaminetriacetic acid, and potassium and sodium salts thereof; nitrilotriacetic acid, and potassium and sodium salts thereof; 1,2-diaminocyclohexanetetraacetic acid, and potassium and sodium salts thereof; 1,3-diamino-2-propanol tetraacetic acid, and potassium and sodium salts thereof; and organic phosphonic acids, phosphonoalkanetricarboxylic acids and salts thereof such as 2-phosphonobutane tricarboxylic acid-1,2,4, and potassium and sodium salts thereof; 2-phosphonobutane tricarboxylic acid-2,3,4, and potassium and sodium salts thereof; 1-phosphonoethane tricarboxylic acid-1,2,2, and potassium and sodium salts thereof; 1-hydroxyethane-1,1-diphosphonic acid, and potassium and sodium salts thereof; and aminotri(methylenephosphonic acid), and potassium and sodium salts thereof. The above-mentioned chelating agent may be in the form of not only a potassium salt or a sodium salt, but also an organic amine salt. It is recommended to select a chelating agent that is stable in the dampening water for practical use and has no adverse effect on the printing properties.

The amount of the chelating agent in the dampening water is generally in the range of 0.001 to 3% by weight, and preferably in the range of 0.01 to 1% by weight.

The dampening water composition according to the present invention may further comprise an antiseptic agent. Examples of the antiseptic agent optionally added to the dampening water composition include benzoic acid and derivatives thereof, phenol or derivatives thereof, formalin, imidazole derivatives, sodium dehydroacetate, 4-isothiazolin-3-one derivatives, benzotriazole derivatives, amidine or guanidine derivatives, quaternary ammonium salts, pyridine or quinoline derivatives, diazine or triazole derivatives, oxazole or oxazine derivatives, halogenonitropropane compounds, and bromonitroalcohols such as bromonitro propanol, 1,1-diboromo-1-nitro-2-ethanol, 3-bromo-3-nitropentane-2,4-diol, and the like.

The antiseptic agent may be added in such an amount that the antiseptic agent can exert its effects stably against bacteria, mold, yeast and the like. The amount of the antiseptic agent, which varies depending on the kinds of bacteria, mold, yeast and the like to be controlled, preferably ranges from 0.0001 to 1.0% by weight on the basis of the total weight of the dampening water. In this respect, it is preferable to use two or more antiseptic agents in combination so that the combination is effective against various kinds of mold, bacteria and yeast.

To the dampening water composition according to the present invention, a coloring agent, an anticorrosive agent, an antifoaming agent and the like may be added. As the coloring agent, food dyes and the like are preferably used. For example, there are yellow dyes such as C.I. 19,140 and C.I. 15,985; red dyes such as C.I. 16,185, C.I. 45,430, C.I. 16,255, C.I. 45,380 and C.I. 45,100; purple dyes such as C.I. 42,640; blue dyes such as C.I. 42,090 and C.I. 73,015; and green dyes such as C.I. 42,095.

Examples of the anti-corrosive agent include benzotriazole, 5-methylbenzotriazole, thiosalicylic acid, and benzimidazole and derivatives thereof.

A silicone type antifoaming agent is preferably used as the antifoaming agent which may be used in the dampening water composition of the present invention. The silicone type antifoaming agent may be in the form of either an emulsion dispersion type or solubilized solution type.

The dampening water composition according to the present invention may further comprise a corrosion inhibitor such as magnesium nitrate, zinc nitrate, calcium nitrate, sodium nitrate, potassium nitrate, lithium nitrate, and ammonium nitrate, a hardener such as chromium compounds and aluminum compounds, an organic solvent such as a cyclic ether including 4-butyrolactone, a water-soluble organic metal compound having surface activity disclosed in J.P. KOKAI No. Sho 61-193893, and the like, in an amount of from 0.0001 to 1% by weight on the basis of the total weight of dampening water.

A small amount of surfactant may be added to the dampening water composition of the present invention. Examples of anionic surfactants for use in the dampening water composition include fatty acid salts, abietic acid salt, hydroxyalkanesulfonates, alkanesulfonates, dialkylsulfosuccinates, linear alkylbenzenesulfonates, branched alkylbenzenesulfonates, alkylnaphthalenesulfonates, alkylphenoxy polyoxyethylenepropylsulfonates, polyoxyethylene alkylsulfophenyl ether salts, sodium salts of N-methyl-N-oleyltaurine, disodium salts of N-alkylsulfosuccinic monoamide, petroleum sulfonates, hydrogenated castor oil, sulfated tallow oil, sulfates of fatty acid alkyl ester, alkyl sulfates, polyoxyethylene alkyl ether sulfates, fatty acid monoglyceride sulfates, polyoxyethylene alkylphenyl ether sulfates, polyoxyethylene styrylphenyl ether sulfates, alkyl phosphates, polyoxyethylene alkyl ether phosphates, polyoxyethylene alkylphenyl ether phosphates, partially saponified styrene-maleic anhydride copolymer, partially saponified olefin-maleic anhydride copolymer, condensates of naphthalenesulfonate and formalin, and the like. Among the anionic surfactants, particularly preferred are dialkylsulfosuccinates, alkyl sulfates and alkylnaphthalenesulfonates.

The following nonionic surfactants can also be used: polyoxyethylene alkyl ethers, polyoxyethylene alkylphenyl ethers, polyoxyethylene polystyrylphenyl ethers, polyoxyethylene polyoxypropylene alkyl ethers, polyoxyethylene-polyoxypropylene block copolymers, partial esters of glycerin fatty acid, partial esters of sorbitan fatty acid, partial esters of pentaerythritol fatty acid, partial esters of propylene glycol monofatty acid, partial esters of sucrose fatty acid, partial esters of polyoxyethylene sorbitan fatty acid, partial esters of polyoxyethylene sorbitol fatty acid, partial esters of polyglycerin fatty acid, castor oil modified with polyoxyethylene, partial esters of polyoxyethylene glycerin fatty acid, fatty acid diethanolamides, N,N-bis-2-hydroxyalkylamines, polyoxyethylene alkylamines, triethanolamine fatty acid esters, trialkylamine oxides, and the like. Among the nonionic surfactants, preferred are polyoxyethylene alkylphenyl ethers, and polyoxyethylene polyoxypropylene block copolymers.

Examples of cationic surfactants for use in the dampening water composition include alkylamine salts, quaternary ammonium salts, polyoxyethylene alkylamine salts, polyethylene polyamine derivatives, and the like. Examples of amphoteric surfactants include alkylimidazolines and the like. As other than the above, fluorine-containing surfactants can also be employed. Examples thereof are a fluorine-containing anionic surfactant such as perfluoroalkylsulfonic acid salts, perfluoroalkylcarboxylic acid salts, and perfluoroalkyl phosphoric esters, a fluorine-containing nonionic surfactant such as perfluoroalkylethyleneoxide adducts, and perfluoroalkylpropyleneoxide adducts, a fluorine-containing cationic surfactant such as perfluoroalkyl trimethylammonium salts, and the like.

The amount of the surfactant to be incorporated in the dampening water is suitably not more than 10% by weight and preferably in the range of from 0.01 to 3.0% by weight, with the problem of foaming taken into consideration. The above-mentioned surfactants may be used alone or in combination.

The dampening water composition according to the present invention may further comprise a wetting agent such as glycols and/or alcohols. Examples of the wetting agent are ethylene glycol monomethyl ether, diethylene glycol monomethyl ether, triethylene glycol monomethyl ether, tetraethylene glycol monomethyl ether, ethylene glycol monoethyl ether, diethylene glycol monoethyl ether, triethylene glycol monoethyl ether, tetraethylene glycol monoethyl ether, ethylene glycol monopropyl ether, diethylene glycol monopropyl ether, triethylene glycol monopropyl ether, tetraethylene glycol monopropyl ether, ethylene glycol monoisopropyl ether, diethylene glycol monoisopropyl ether, triethylene glycol monoisopropyl ether, tetraethylene glycol monoisopropyl ether, ethylene glycol monobutyl ether, diethylene glycol monobutyl ether, triethylene glycol monobutyl ether, tetraethylene glycol monobutyl ether, ethylene glycol monoisobutyl ether, diethylene glycol monoisobutyl ether, triethylene glycol monoisobutyl ether, tetraethylene glycol monoisobutyl ether, ethylene glycol monotertiarybutyl ether, diethylene glycol monotertiarybutyl ether, triethylene glycol monotertiarybutyl ether, tetraethylene glycol monotertiarybutyl ether, propylene glycol monomethyl ether, dipropylene glycol monomethyl ether, tripropylene glycol monomethyl ether, tetrapropylene glycol monomethyl ether, propylene glycol monoethyl ether, dipropylene glycol monoethyl ether, tripropylene glycol monoethyl ether, tetrapropylene glycol monoethyl ether, propylene glycol monopropyl ether, dipropylene glycol monopropyl ether, tripropylene glycol monopropyl ether, tetrapropylene glycol monopropyl ether, propylene glycol monoisopropyl ether, dipropylene glycol monoisopropyl ether, tripropylene glycol monoisopropyl ether, tetrapropylene glycol monoisopropyl ether, propylene glycol monobutyl ether, dipropylene glycol monobutyl ether, tripropylene glycol monobutyl ether, tetrapropylene glycol monobutyl ether, propylene glycol monoisobutyl ether, dipropylene glycol monoisobutyl ether, tripropylene glycol monoisobutyl ether, tetrapropylene glycol monoisobutyl ether, propylene glycol monotertiarybutyl ether, dipropylene glycol monotertiarybutyl ether, tripropylene glycol monotertiarybutyl ether, tetrapropylene glycol monotertiarybutyl ether, polypropylene glycol having a molecular weight of from 200 to 1000 and monomethyl, monoethyl, monopropyl, monoisopropyl or monobutyl ether thereof, propylene glycol, dipropylene glycol, tripropylene glycol, tetrapropylene glycol, pentapropylene glycol, ethylene glycol, diethylene glycol, triethylene glycol, polyethylene glycol, butylene glycol, hexylene glycol, ethyl alcohol, n-propyl alcohol, benzyl alcohol, ethylene glycol monophenyl ether, 2-ethyl-1,3-hexanediol, 3-methoxy-3-methyl-1-butanol, 1-butoxy-2-propanol, diglycerin, polyglycerin, trimethylolpropane, pentaerythritol, methoxyethanol, ethoxyethanol, butoxyethanol, 3-methoxybutanol, and the like.

The wetting agent may be used alone or in combination. The amount of the wetting agent generally ranges from 0.01 to 1% by weight in the dampening water.

The remainder of the dampening water composition according to the present invention is water.

Generally, a dampening water composition is commercialized as a concentrated product for a dampening water. Accordingly, the above-mentioned components are dissolved in water, preferably demineralized water, i.e., pure water to obtain an aqueous solution as the concentrated dampening water composition. The concentrated dampening water composition is usually diluted about 10 to 200 times with tap water or well water at the time of a practical use, and then the dampening water for practical use can be obtained.

According to the dampening water composition of the present invention, isopropyl alcohol can be completely replaced, with no combination use of a volatile organic solvent. Thus, the dampening water composition of the present invention can be prepared into a dampening water composition that is substantially free of a volatile organic solvent. The term "substantially free of a volatile organic solvent" herein denotes that the amount of a volatile organic solvent on the basis of a dampening water composition, which is a concentrated composition, is not more than 10% according to a determination by ASTM D 2369-95 Method.

According to ASTM D 2369-95 Method, 3 ml of a sample is subjected to under the condition of a hot air oven at a temperature of 110□ for one hour to determine an amount of a volatile organic solvent contained in the sample by the following formula:

{(a weight of the sample−a weight of nonvolatile content−a weight of moisture content of the sample)/(a weight of the sample)}×100=an amount of a volatile organic solvent (% by weight).

The dampening water composition of the present invention may further comprise isopropyl alcohol, provided that the amount of isopropyl alcohol is preferably controlled to about 1 to 15% by weight of the dampening water for practical use, without incident on printing quality.

The dampening water composition of the present invention can be applied to various types of a lithographic printing plate, and in particular, preferably applied to a lithographic printing plate which has been prepared by image-wise exposing and developing a presensitized plate for use in making a lithographic printing plate, which presensitized plate has a photosensitive layer provided on a substrate of aluminum plate, said presensitized plate being referred to as PS plate. Among the above PS plates, preferred are for example, the one that has a photosensitive layer comprising a mixture of a diazo resin and shellac, said diazo resin consisting of a salt of condensate of p-diazodiphenylamine and paraformaldehyde, and said photosensitive layer being provided on an aluminum plate, as disclosed in British Patent No. 1,350,521, the one that has a photosensitive layer comprising a mixture of a diazo resin and a polymer having a primary repeating unit of a hydroxyethylmethacrylate unit or a hydroxyethylacrylate unit, said photosensitive layer being provided on an aluminum plate, as disclosed in British Patent Nos. 1,460,978 and 1,505,739, a negative type one wherein a photosensitive system of a photosensitive polymer carrying a dimethylmaleimide group is provided on an aluminum plate, as disclosed in J.P. KOKAI Nos. Hei 2-236552, and Hei 4-274429, and a positive type one wherein a photosensitive layer comprising a mixture of an o-quinone diazido photosensitive component and a novolac type phenol resin is provided on an aluminum plate, as disclosed in J.P. KOKAI No. Sho 50-125806. The dampening water composition of the present invention may be also applied to a lithographic printing plate from a positive type PS plate, said lithographic printing plate having been subjected to a burning treatment.

In the composition forming the above photosensitive layer, an alkali-soluble resin other than the alkali-soluble novolac resin may be incorporated, if necessary. Such an alkali-soluble resin includes for example, styrene-acrylic acid copolymer, methylmethacrylate-methacrylic acid copolymer, alkali-soluble polyurethane resin, alkali-soluble vinyl resin as disclosed in J.P. KOKOKU (publication of examined application) No. Sho 52-28401, and alkali-soluble polybutyral resin. Further, a PS plate wherein a photosensitive layer of photopolymerizable photopolymer composition is provided on an aluminum plate as disclosed in U.S. Pat. Nos. 4,072,528 and 4,072,527, and a PS plate wherein a photosensitive layer comprising a mixture of an azide compound and a water-soluble polymer is provided on an aluminum plate as disclosed in British Patent Nos. 1,235,281 and 1,495,861 are preferable.

Furthermore, the dampening water composition of the present invention can be preferably applied to a CTP plate, which has been directly exposed by a visible or infrared laser, and examples thereof include a photopolymer type digital plate such as LP-NX manufactured by Fuji Photo Film Co., Ltd., a thermal positive type digital plate such as LH-PI manufactured by Fuji Photo Film Co., Ltd., and a thermal negative type digital plate such as LH-NI manufactured by Fuji Photo Film Co., Ltd.

The dampening water composition of the present invention will hereunder be explained in more detail with reference to the following non-limitative working examples and comparative examples. In the following Examples and Comparative Examples, the term "%" means "% by weight", unless otherwise specified.

EXAMPLES 1 TO 6 AND COMPARATIVE EXAMPLES 1 TO 4

According to the formulations shown in Table 1, various dampening water compositions of Examples 1 to 6 and Comparative Examples 1 to 4 were prepared. In the table, a unit of numerical values is gram, and water is finally added up to 1000 ml in total volume of the composition. All the compositions thus prepared are concentrated types, and they will be diluted when practically used.

TABLE 1

| | Examples | | | | | | Comparative Examples | | | |
|---|---|---|---|---|---|---|---|---|---|---|
| | 1 | 2 | 3 | 4 | 5 | 6 | 1 | 2 | 3 | 4 |
| [Ethylenediamine PO/EO adduct] | | | | | | | | | | |
| EO:PO ratio*(25:75) Mw: 300 | — | — | — | — | — | — | 50 | — | — | — |
| EO:PO ratio*(0:100) Mw: 1000 | — | — | — | — | — | — | — | 50 | — | — |
| EO:PO ratio*(25:75) Mw: 1000 | 50 | 50 | 50 | — | 50 | 50 | — | — | — | — |
| EO:PO ratio*(60:40) Mw: 1000 | — | — | — | 50 | — | — | — | — | — | — |
| EO:PO ratio*(25:75) Mw: 2000 | — | — | — | — | — | — | — | — | 50 | — |
| [Water-soluble polymeric compounds] | | | | | | | | | | |
| Polyvinylpyrrolidone K-15 | 40 | 40 | — | — | — | — | 40 | 40 | 40 | — |
| Polyvinylpyrrolidone K-30 | — | — | 40 | 40 | — | — | — | — | — | 40 |
| Hydroxypropylcellulose | — | — | — | — | — | 40 | — | — | — | — |
| Carboxymethylcellulose | — | 40 | — | — | 40 | — | — | 40 | — | — |
| [Sugars and Glycerin] | | | | | | | | | | |
| Glucose | 50 | — | — | — | — | — | 50 | — | 50 | — |
| Sorbitol | — | 100 | — | — | 100 | — | — | 100 | — | 100 |
| Saccharose | — | — | 50 | 50 | — | 50 | — | — | — | — |
| Maltitol | 50 | — | — | — | — | — | 50 | — | 50 | — |
| Glycerin | — | — | 50 | 50 | — | 50 | — | — | — | — |
| [pH adjusting agent] | | | | | | | | | | |
| Gluconic acid | 10 | 10 | 10 | 10 | 10 | 10 | 10 | 10 | 10 | 10 |
| Ammonium primary citrate | 10 | 10 | 10 | 10 | 10 | 10 | 10 | 10 | 10 | 10 |
| Ammonium primary phosphate | 5 | 5 | 5 | 5 | 5 | 5 | 5 | 5 | 5 | 5 |
| Ammonium nitrate | 10 | 10 | 10 | 10 | 10 | 10 | 10 | 10 | 10 | 10 |
| 4-isothiazolin-3-on derivative [antiseptic agent] | 4 | 4 | 4 | 4 | 4 | 4 | 4 | 4 | 4 | 4 |
| Pure water | Up to 1000 ml in total volume of the composition | | | | | | | | | |

*EO:PO ratio: molar ratio of added ethylene oxide and added propylene oxide

The compositions for Examples 1 to 6 and Comparative Examples 1 to 4 prepared above were diluted with a dilution rate of 40 times with simulated hard water having a hardness of 400 ppm, and adjusted about pH 4.8 to 5.3 with NaOH/phosphoric acid (85%) to obtain a dampening water in practical use. Further, isopropyl alcohol in an amount of 8% and a dampening water "EU-3" manufactured by Fuji Photo Film Co., Ltd. in an amount of 1% were added to simulated hard water having a hardness of 400 ppm to prepare a dampening water in practical use of Comparative Example 5.

[Test Method]

In order to carry out a printing test, a printing press "Heidelberg MOV" (Alcolor dampener), color inks of process 4 colors (cyan, magenta, yellow, black) under the name of "Hy Unity" manufactured by Toyo Ink MFG Co., LTD., solid area and 30% dot area of a positive PS plate "VS" manufactured by Fuji Photo Film Co., Ltd., and a film of FQI chart manufactured by Fuji Photo Film Co., Ltd. were used.

The plate was exposed by a PS light manufactured by Ushio Inc., developed with a developing solution "DP-4" manufactured by Photo Film Co., Ltd., and then treated with a gum solution "FP-2" manufactured by Photo Film Co., Ltd. to obtain a processed plate to be used in a printing test.

A printing test was carried out by using the resultant plate.

(a) Stability of Continuous Printing

A minimum amount of supplied dampening water, which does not cause smudge or wash out, was determined, and then the stability of continuous printing was evaluated by observing how many of sheets could be printed until a favorable printed matter could not be obtained because of smudge of printed matter or wash out.

More than 10,000 sheets: A

From 10,000 to 3000 sheets: B

From 2999 to 1 sheets: C

Nil: D (b) Emulsification Property

An emulsification property was evaluated by observing an emulsified state of ink on ink rollers at the time of printing of 10,000 sheets.

Good: A

Baddish: B

Bad: C (c) Deterioration of Image Area

The printing press was stopped, then each dampening water was dropped using a syringe, in amounts of 5 μl, 10 μl, 20 μl and 50 μl, on image areas of the solid portion and 30% dot portion on the plate, and the plate was left for 60 minutes. Then, printing was restated and deterioration of the image area was evaluated.

No problems: A

Slight deterioration: B (a trace in the form of ring was observed.)

Apparent deterioration: C

Results obtained were shown in Table 2 below.

TABLE 2

| | Examples | | | | | | Comparative Examples | | | | |
|---|---|---|---|---|---|---|---|---|---|---|---|
| | 1 | 2 | 3 | 4 | 5 | 6 | 1 | 2 | 3 | 4 | 5 |
| stability of continuous printing | A | A | A | B | B | B | D | C | A | D | A |
| emulsification property | A | A | A | B | A | B | A | C | B | B | A |
| deterioration of image areas | A | A | A | A | A | A | A | B | C | A | A |

As seen from the above results, the dampening water embodied according to the present invention exhibits excellent performances on any of stability of continuous printing, emulsification property and deterioration of image areas, and said dampening water can yield favorable printed matter which is similar as when the dampening water of Comparative Example 5 using isopropyl alcohol is used. Further, the dampening waters according to Examples 1 to 6 have no problems concerning safety of working environment and fire, which is different from isopropyl alcohol, and can avoid the use of an organic solvent that is usually used in a conventional dampening water to substitute for isopropyl alcohol, then being environmentally favorable since the amount of volatile organic solvent can be extremely smaller.

What is claimed is:

1. A dampening water for a lithographic printing which is prepared by dilution of a dampening water composition comprising an adduct compound of ethylene oxide and propylene oxide to ethylenediamine, which compound has a weight-average molecular weight of from 800 to 1200 and a molar ratio of added ethylene oxide and added propylene oxide ranging from 5:95 to 50:50, at least one selected from carboxymethylcellulose, hydroxypropylcellulose and polyvinylpyrrolidone, at least one selected from sugars, and a pH adjusting agent selected from organic acids, inorganic acids, and a salt thereof so that the dampening water has a pH value of from 3 to 6, said dampening water being substantially free of a volatile organic solvent, said dampening water comprising the adduct compound of ethylene oxide and propylene oxide to ethylenediamine in an amount of 0.01 to 1% by weight, said at least one selected from carboxymethylcellulose, hydroxypropylcellulose and polyvinylpyrrolidone in an amount of from 0.003 to 1% by weight, said at least one selected from sugars in an amount of from 0.01 to 1% by weight, and water in a predominant amount.

2. The dampening water for a lithographic printing of claim 1, wherein the adduct compound of ethylene oxide and propylene oxide to ethylenediamine is represented by the following formula:

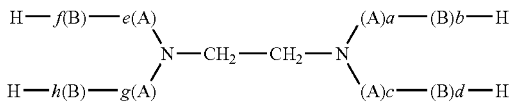

wherein A and B represent each independently $-CH_2CH_2O-$ or $-CH_2CH(CH_3)O-$, A and B are different from each other, a, b, c, d, e, f, g and h represent each an integer of 1 or more so that the molecular weight of the compound ranges from 800-1200, and each copolymer chain may have a block structure or a random structure.

3. The dampening water for a lithographic printing of claim 1, wherein the adduct compound of ethylene oxide and propylene oxide to ethylenediamine has a molar ratio of added ethylene oxide and added propylene oxide ranging from 20:80 to 35:65.

4. The dampening water for a lithographic printing of claim 1, comprising polyvinylpyrrolidone.

5. The dampening water for a lithographic printing of claim 1, wherein the sugar is selected from monosaccharides, disaccharides, oligosaccharides, sugar alcohols and reduced starch syrup.

6. The dampening water for a lithographic printing of claim 5, wherein the sugar is selected from D-erythrose, D-threose, D-arabinose, D-ribose, D-xylose, D-erythro-pentulose, D-allulose, D-galactose, D-glucose, D-mannose, D-talose, β-D-fructose, α-L-sorbose, 6-deoxy-D-glucose, D-glycero-D-galactose, α-D-allulo-heptulose, β-D-altro-3-heptulose, saccharose, lactose, D-maltose, isomaltose, inulobiose, maltotriose, D,L-arabite, ribite, xylitol, D,L-sorbite, D,L-mannite, D,L-idite, D,L-talite, dulcite, allodulcite, maltitol, and reduced starch syrup.

7. The dampening water for a lithographic printing of claim 1, comprising the adduct compound of ethylene oxide and propylene oxide to ethylenediamine in an amount of from 0.05 to 0.5% by weight.

8. The dampening water for a lithographic printing of claim 1, comprising polyvinylpyrrolidone in an amount of from 0.005 to 0.2% by weight.

9. The dampening water for a lithographic printing of claim 1, comprising at least one sugar in an amount of from 0.05 to 0.5% by weight.

* * * * *